(12) United States Patent
Johnson et al.

(10) Patent No.: US 7,786,724 B1
(45) Date of Patent: Aug. 31, 2010

(54) METHODS AND APPARATUS FOR COLLECTING PROCESS CHARACTERIZATION DATA AFTER FIRST FAILURE IN A GROUP OF TESTED DEVICES

(75) Inventors: Morgan T. Johnson, Portland, OR (US);
Lawrence H. Walls, Portland, OR (US);
Raymond J. Werner, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 3 days.

(21) Appl. No.: 12/427,748

(22) Filed: Apr. 22, 2009

(51) Int. Cl.
*G01R 31/02* (2006.01)
(52) U.S. Cl. .................... 324/158.1; 324/763
(58) Field of Classification Search ........................ None
See application file for complete search history.

(56) References Cited

U.S. PATENT DOCUMENTS

| | | | | |
|---|---|---|---|---|
| 5,311,473 A | * | 5/1994 | McClure et al. | 365/201 |
| 5,661,407 A | * | 8/1997 | Shibata | 324/763 |
| 6,286,115 B1 | * | 9/2001 | Stubbs | 714/718 |

* cited by examiner

*Primary Examiner*—Paresh Patel
(74) *Attorney, Agent, or Firm*—Raymond J. Werner (57) ABSTRACT

Collecting process characterization data local to a failed integrated circuit (IC), includes providing a wafer having ICs, each IC having contact terminals, the wafer having process characterization test sites distributed across it such that at least one process characterization test site is adjacent each IC; selecting two or more ICs for simultaneous testing; for each of those ICs, coupling two or more contact terminals of the selected IC, and a corresponding two or more contact terminals of an associated test site to corresponding input terminals of a multiplexer, each multiplexer having an output terminal and a select control input terminal, the multiplexer operable to selectively provide an electrical pathway between either an IC contact terminal or a test site contact terminal and the multiplexer output terminal; coupling the output terminal of each multiplexer to a tester channel; operating the multiplexer so that its output terminal is coupled to the IC contact terminal; simultaneously testing two or more ICs; detecting a failure of at least one of the selected ICs prior to completion of testing the remaining ICs simultaneously being tested; subsequent to detecting the failure, operating the multiplexer so that its output terminal is coupled to the test site contact terminal; and collecting process characterization data prior to completion of testing the remaining ICs.

10 Claims, 8 Drawing Sheets

METHODS AND APPARATUS FOR COLLECTING PROCESS CHARACTERIZATION DATA AFTER FIRST FAILURE IN A GROUP OF TESTED DEVICES

FIELD OF THE INVENTION

The present invention relates generally to semiconductor test equipment and test methods; and more particularly relates to equipment and methods for collecting process characterization data local to a failed integrated circuit.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, planarizing and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

Historically, unsingulated integrated circuits on a wafer were tested one at a time. In order to reduce costs and improve return on investment, the amount of time that each wafer spends in the testing process should be reduced. Various methods and apparatus have been sought by manufacturers for testing two or more integrated circuits at the same time. In this way, wafer throughput can be increased. A typical requirement for testing more than one integrated circuit at a time is to increase the number of tester channels on the tester. In such a parallel testing scheme, when a first one of the two or more integrated circuits is determined to fail the test program, the one or more remaining integrated circuits in that group must continue with, and complete, the test sequence before another group of integrated circuits on the wafer can begin the process of being simultaneously tested. This means that the tester channels dedicated to the integrated circuit that failed are not usefully occupied until the test system is ready to test the next group of integrated circuits on the wafer.

What is needed are methods and apparatus for collecting process characterization data in the time period between the detection of a failure of a first one of a group of integrated circuits being simultaneously tested, and prior to the completion of the test sequence for a "good" integrated circuit, to collect electrical data from one or more process characterization test sites that are local to, that is in proximity with, the failed device under test.

SUMMARY OF THE INVENTION

Briefly, methods and apparatus for collecting process characterization data local to a failed integrated circuit (IC), includes providing a wafer having ICs, each IC having contact terminals, the wafer having process characterization test sites distributed across it such that at least one process characterization test site is adjacent each IC; selecting two or more ICs for simultaneous testing; for each of those ICs, coupling two or more contact terminals of the selected IC, and a corresponding two or more contact terminals of an associated process characterization test site to corresponding input terminals of a multiplexer, each multiplexer having an output terminal and a select control input terminal, the multiplexer operable to selectively provide an electrical pathway between either an IC contact terminal or a process characterization test site contact terminal and the multiplexer output terminal; coupling the output terminal of each multiplexer to a tester channel; operating the multiplexer so that its output terminal is coupled to the IC contact terminal; simultaneously testing two or more ICs; detecting a failure of at least one of the selected ICs prior to completion of testing the remaining ICs simultaneously being tested; subsequent to detecting the failure, operating the multiplexer so that its output terminal is coupled to the process characterization test site contact terminal; and collecting process characterization data prior to completion of testing the remaining ICs.

In some embodiments, the associated process characterization test site is adjacent to the selected integrated circuit.

The figures illustrate various components and their arrangements and interconnections. Unless expressly stated to the contrary, the figures are not necessarily drawn to scale.

DETAILED DESCRIPTION

Generally, in systems for concurrently or simultaneously testing multiple integrated circuits on a wafer, the present invention utilizes the time available between the detection of a failure of a first one of the multiple integrated circuits, and prior to the completion of the test sequence for a "good"

integrated circuit, to collect electrical data from one or more process characterization test sites that are local to, that is in proximity with, the failed device under test. In accordance with the present invention, local process characterization test site contact terminals are multiplexed with a corresponding number of DUT contact terminals, so that the data gathering that takes place during this time interval occurs without the need for additional tester channels. Subsequent to detection of the failure, a multiplexer select control signal is generated to operate a multiplexer such that the tester pin electronics coupled to the DUT prior to failure detection, are switched so those tester pin electronics are coupled to the local process characterization test site contact terminals.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The term "tester" as used herein refers to equipment, typically electrical equipment, that is used to determine whether a, integrated circuit is performing in accordance with a predetermined specification.

ATE stand for automatic test equipment, or alternatively automated test equipment, and, as used herein, refers to a tester suitable for determining whether an integrated circuit performs in compliance with a known specification.

The expression "pin electronics" refers to the circuitry of the tester that is coupled to the contact terminals of the integrated circuit. Generally, there is one set of pin electronics for each contact terminal of the device under test (DUT).

The expression "tester channels" refers to the number of individual signal paths that a tester provides. Generally, there is one tester channel for each contact terminal of the one or more devices under test. In this field, tester channels are also sometimes referred to as "pins", in reference to the contact terminals of the device under test, which in the early history of integrated circuits were the external pins found on packaged integrated circuits. Tester channels is the preferred nomenclature in this description.

The term "pad", as used herein, refers to an electrically conductive region of the surface of an integrated circuit, which is used to form a physical connection terminal for communicating signals to and/or from the integrated circuit. The pad is typically formed from a metal or metal alloy.

FET, as used herein, refers to metal-oxide-semiconductor field effect transistors (MOSFETs). An n-channel FET is referred to herein as an NFET. A p-channel FET is referred to herein as a PFET.

Source/drain (S/D) terminals refer to the terminals of a FET, between which conduction occurs under the influence of an electric field, subsequent to the inversion of the semiconductor surface under the influence of an electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The expression "wafer translator" refers to an apparatus facilitating the connection of I/O pads (sometimes referred to as terminals, pads, contact pads, bonding pads, chip pads, or test pads) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator may be disposed between a wafer and other electrical components. The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the I/O pads of the integrated circuits on the wafer. The wafer translator, when disposed between a wafer and other electrical components, makes electrical contact with one or more I/O pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer that has a wafer translator attached thereto, wherein a predetermined portion of, or all of, the contact pads of the integrated circuits on the wafer are in electrical contact with corresponding electrical connection means disposed on the wafer side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Figure 1:
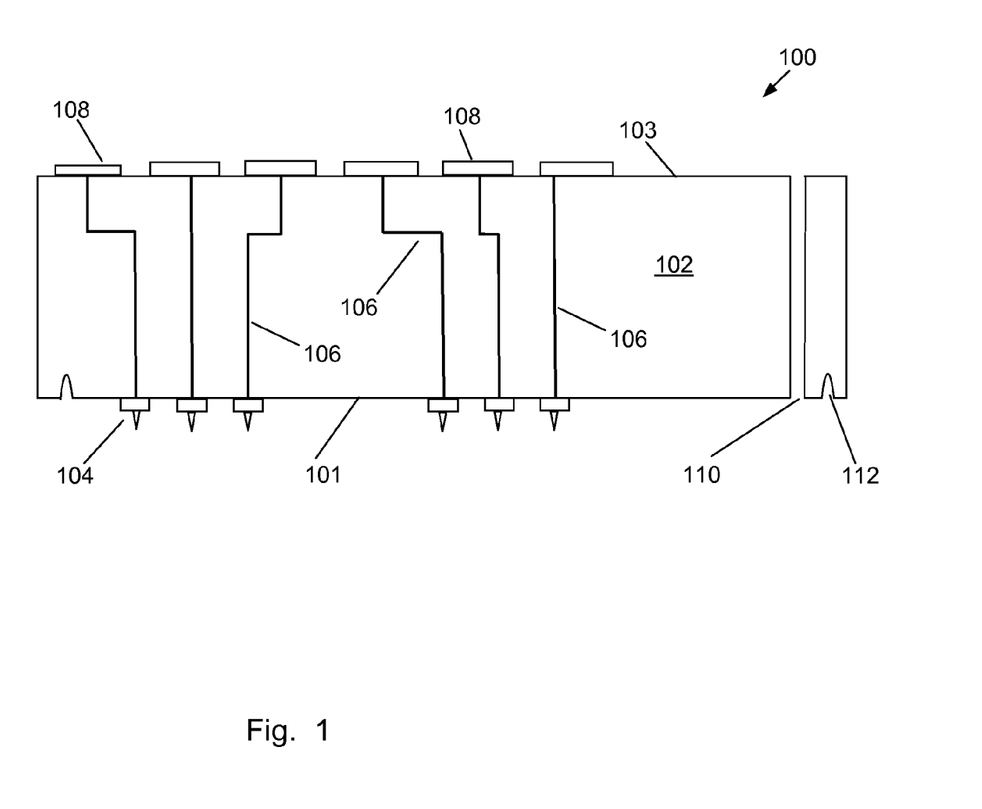
FIG. 1 is a cross-sectional view of an illustrative wafer translator.

FIG. 1 is a cross-sectional view of an illustrative wafer translator 100. Wafer translator 100 includes a substrate 102 with a first major surface 101 and a second major surface 103. First major surface 101 may be referred to as the wafer-side of wafer translator 102. Second major surface 103 may be referred to as the inquiry-side of wafer translator 102. Alternatively, second major surface 103 may be referred to as the tester-side. Contact structures 104 are disposed on wafer-side 103. Contact structures 104 are arranged in a pattern such that they match the layout of pads disposed on the integrated circuits and process characterization test sites of a predetermined wafer. Contact terminals 108 are disposed on the tester-side 103 of wafer translator 102. Contact terminals 108 are typically larger than contact structures 104, and are typically laid out in a regular pattern intended to couple with a tester or tester interface. Contact terminals 108 and contact structures 104 are electrically coupled by conductive paths 106. Illustrative wafer translator 102 further includes an evacuation pathway 110, and a groove 112 for receiving a gasket, such as an O-ring. The combination of evacuation pathway 112 and a gasket (not shown) set in groove 112, facilitate the removable attachment of a wafer with wafer translator 102. Removable attachment may be achieved by aligning the wafer and wafer translator, bringing them into contact, and evacuating the space between them through evacuation path 110.

It will be appreciated that removable attachment of the wafer with the wafer translator may be achieved with alternative arrangements, including but not limited to, aligning the wafer and wafer translator/gasket with each other, in an evacuated chamber, urging them into contact, and returning the atmosphere to the chamber. In this way, the space between the wafer and the wafer translator is evacuated without the need for an evacuation pathway through the translator.

Figure 2:
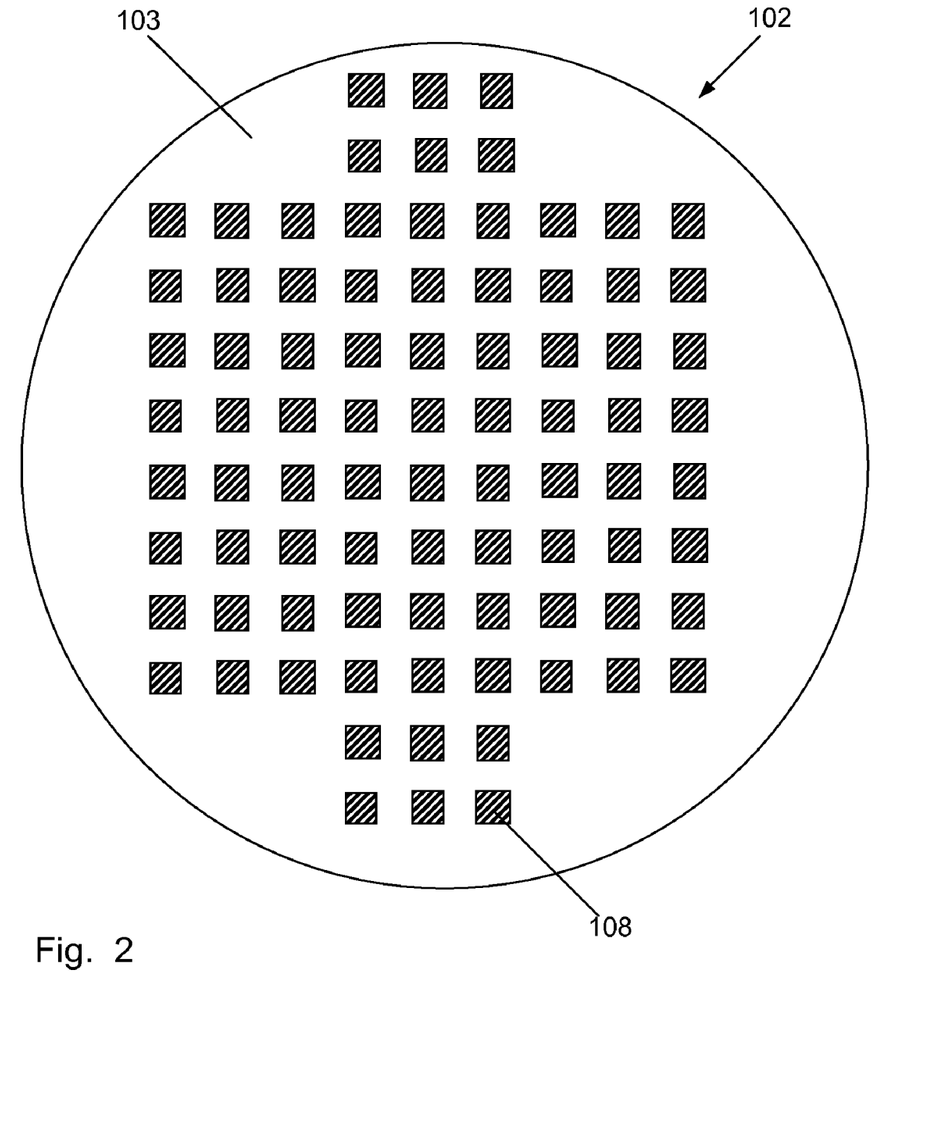
FIG. 2 is a top view of a portion of an illustrative wafer translator, showing contact terminals on the inquiry-side of the wafer translator.

FIG. 2 is a top view of illustrative wafer translator 102, showing contact terminals 108 on the inquiry-side 103 of the wafer translator 102. It is noted that the present invention is not limited any particular number, size, or arrangement of contact terminals 108. Typically, tester channels, or pin electronics, of a tester are coupled to contact terminals 108 of wafer translator 102.

Figure 3:
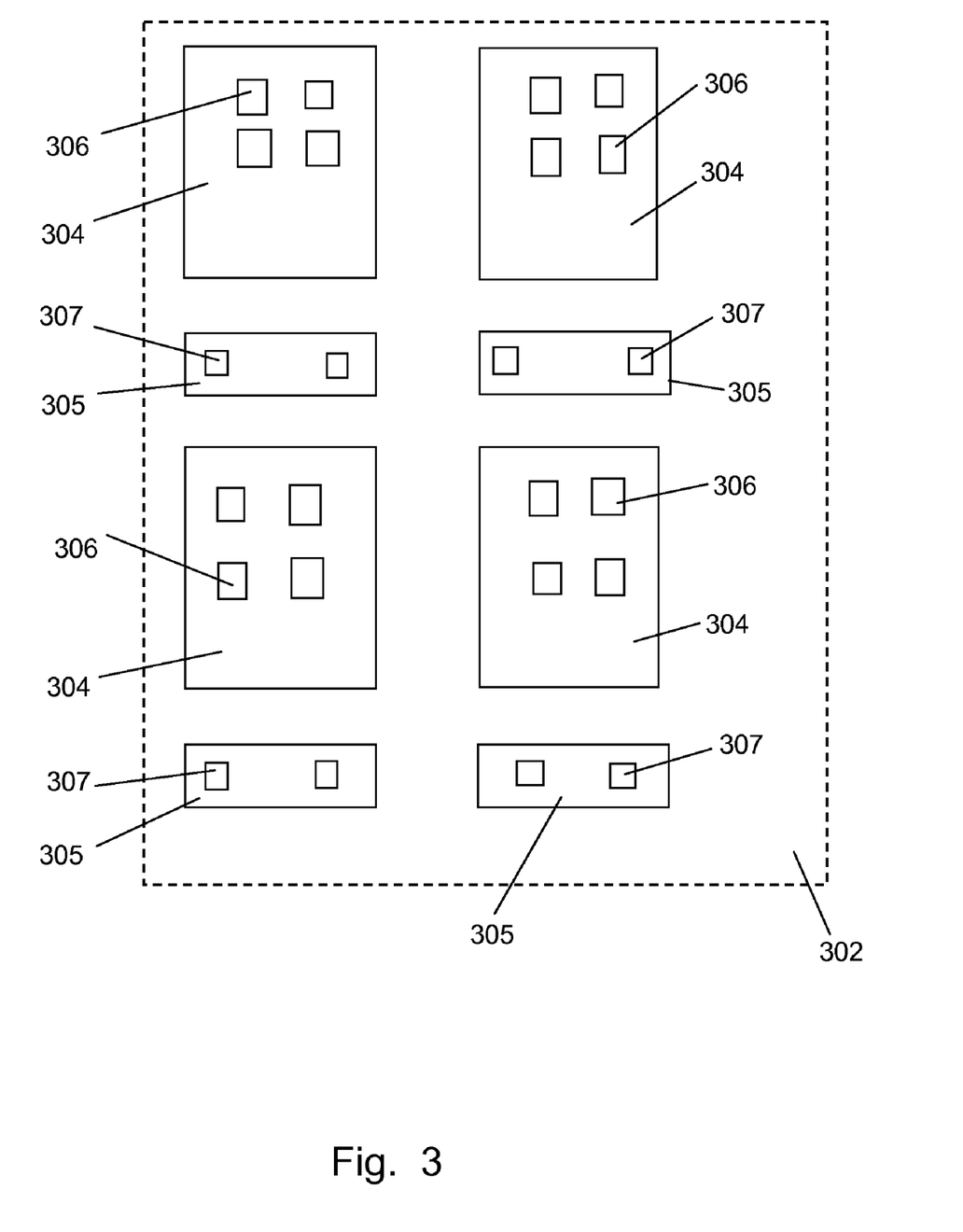
FIG. 3 is a top view of a portion of a wafer having a plurality of integrated circuits and a corresponding plurality of process characterization test sites.

Referring to FIG. 3, a top view of a portion of an illustrative wafer having a plurality of integrated circuits and a corresponding plurality of process characterization test sites is shown. More particularly, a representative portion 302 of the wafer includes a plurality of integrated circuits 304, and a plurality of process characterization test sites 305. Each of integrated circuits 304 has a plurality of contact pads 306 disposed thereon. It is noted that the present invention is applicable to integrated circuits 304 with any number of contact pads 306, and is not limited to integrated circuits 304 having any particular number of pads 306, or any particular layout or arrangement of those pads 306. Each of process characterization test sites 305 has a plurality of contact pads 307 disposed thereon. It is noted that the present invention is applicable to process characterization test sites 305 with any number of contact pads 307, and is not limited to process characterization test sites 305 having any particular layout or arrangement of those pads 307. Process characterization test sites 305 may include one or more structures, sometimes referred to as test structures, from which various electrical characteristics may be obtained. These structures may include active and/or passive electrical elements such as but not limited to, diodes, transistors, resistors and capacitors; and may include circuits formed from combinations of interconnected electrical elements. Process characterization test sites 305 may be referred to as electrical test sites, or by similar names, terms and expressions. The electrical characteristics obtainable from process characterization test sites 305 may include, but are not limited to, sheet resistivity of various materials, contact resistance, capacitance, transistor threshold voltage, transistor leakage current, junction leakage current, and so on. In this illustrative embodiment, process characterization test sites 305 are disposed across the wafer, with each one being in close proximity to at least one of integrated circuits 304. It is noted that electrical characteristics typically vary within some range across a wafer. Those skilled in the art and having the benefit of the present disclosure will appreciate that collecting the process characterization information, i.e., electrical data, from a test site that is essentially co-located with a failed IC results in data that very closely tracks with the electrical characteristics of the failed IC itself. In this way, analysis of the connection between the failure mode and the electrical characteristics of the integrated circuit, is more accurate than previous methods because variations in such electrical characteristics across the wafer have been substantially removed from the analysis.

In alternative embodiments, the wafer translator provides concurrent access to a plurality of process characterization test sites 305 across the wafer so that a detailed mapping of the variations across the wafer can be made. Such detailed mappings may be correlated with yield maps of ICs that passed various functional tests. Furthermore, such detailed mappings may be useful in yield improvement studies by providing the electrical characteristics of integrated circuits so that performance can be related to various combinations of electrical parameters or characteristics.

In the example of FIG. 3, process characterization test sites 305 are placed adjacent to integrated circuits 304, and are present in numbers equal to the number of integrated circuits. Those skilled in the art and having the benefit of the present disclosure will appreciate that process characterization test sites 305, may be placed in the scribe alley, that is, the regions of the wafer in between integrated circuits 304. In various embodiments, process characterization test sites 305 may be placed more or less frequently, such that a test site may be present at each side of an IC, or such that the test sites are placed such that there are two or more intervening IC locations between the test sites. In alternative embodiments, one or more process characterization test sites 305 may be located on an integrated circuit 304.

Figure 4:
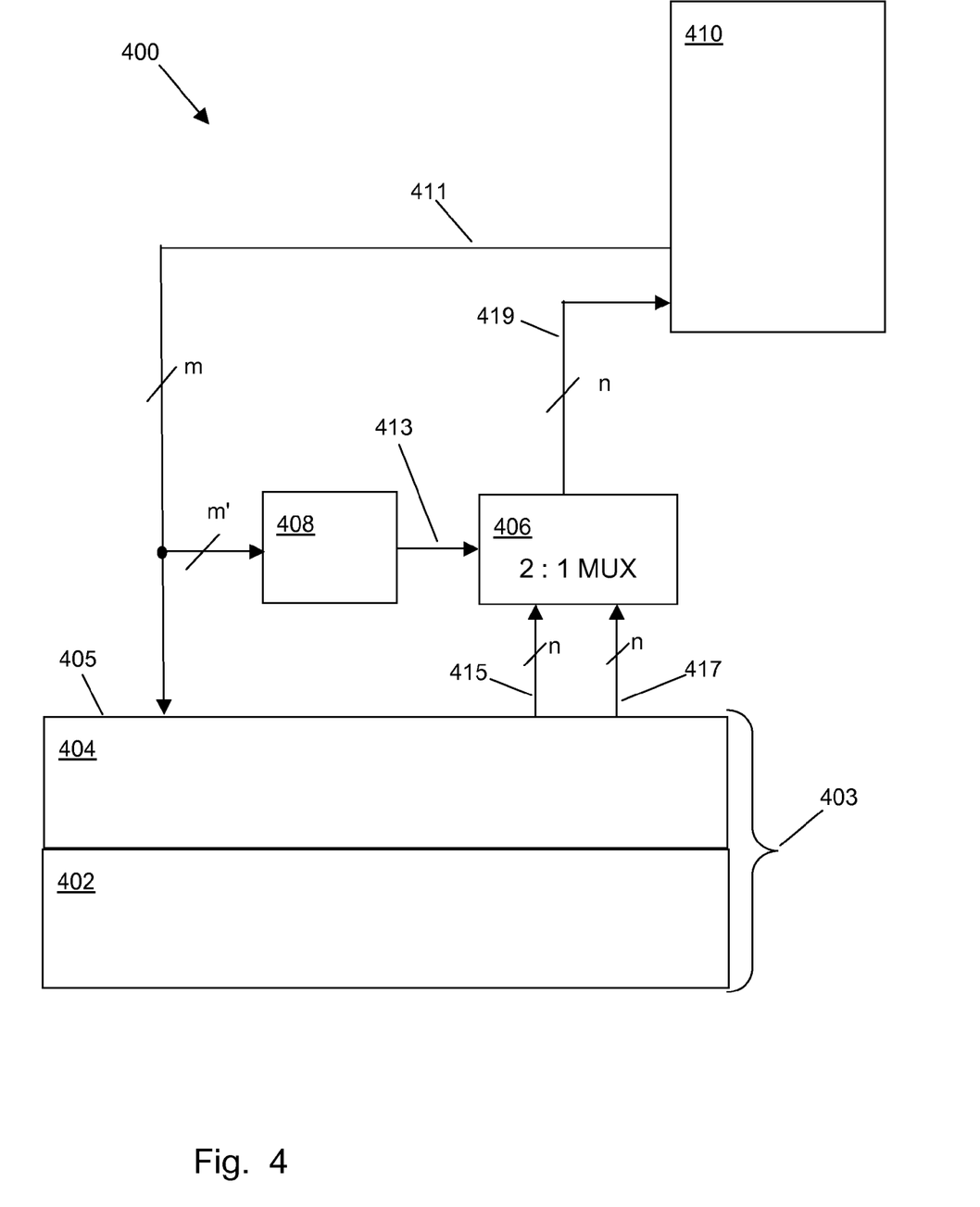
FIG. 4 is a schematic block diagram of a system in accordance with the present invention, including a wafer/wafer translator pair in the attached state, a multiplexer and multiplexer select control logic, and signal paths between an integrated circuit on the wafer through the wafer translator, through the multiplexer and coupled to a tester.

Referring to FIG. 4, a schematic block diagram of a system 400 in accordance with the present invention is shown. The illustrative embodiment of FIG. 4 includes a wafer 402 and a wafer translator 404 that are removably attached to each other to form a wafer/wafer translator pair 403 in the attached state, a multiplexer 406, a multiplexer select control block 408, a tester 410, and signal paths (not shown) within wafer translator 404 between the wafer-side and the tester-side of wafer translator 404. These signal paths are used to conduct signals to and from at least two integrated circuits on wafer 402, and to and from at least one process characterization test site on wafer 402.

In some embodiments, multiplexer 410 and multiplexer select control block 408 are disposed on inquiry-side 405 of wafer translator 404. In such an arrangement, the output terminal of multiplexer 406 is coupled to a contact terminal on inquiry-side 405 of wafer translator 404.

Tester 410 (sometimes referred to as an ATE) is coupled to inquiry-side 405 of wafer translator 404 by means of a first communication pathway 411, and a second communication pathway 419. In this illustrative embodiment, communication pathway 411 is m bits wide, where m is an integer; and communication pathway 419 is n bits wide, where n is an integer. Communication pathway 411 represents lines sourced from tester 410 and received at inquiry-side 405 of wafer translator 404. Communication pathway 419 represents lines sourced by multiplexer 406 and received at tester 410. It will be appreciated that in alternative arrangements, tester channels may be bidirectional, and those skilled in the field will recognize that inclusion of transceivers that have output drivers with high-impedance off-state (i.e., tri-state) operation may be used.

Still referring to FIG. 4, it is noted that tester 410, through communication pathway 411 may drive both the integrated circuits and the process characterization test sites that are disposed on wafer 402.

Select control block 408 is coupled to at least a subset m' of communication pathway 411. Select control block 408 uses the m' bits from communication pathway 411 to generate a select control signal on node 413. Multiplexer 406 has a select control input terminal that is coupled to node 413. The select control signal is used by 2:1 multiplexer 406 to select between input 415 from an integrated circuit and input 417 from a process characterization test site. Select control block 408 is typically a logic circuit that looks for a particular data pattern coming from tester 410 which, when recognized, results in select control block 408 changing the logical state of node 413. By changing the state of node 413, data from the process characterization test sites rather than from the "product" integrated circuits is passed to tester 410. In some embodiments of the present invention where select control block 408 includes one or more data storage elements, a separate reset signal may coupled to select control block 408, whereas in other such embodiments a particular combination of bits on communication pathway 411 may be recognized by logic circuits within block 408 as a reset signal. Implementation of these different approaches is well within the skills of the ordinary practitioner of logic design, and the details of these circuits are not discussed further herein.

It will be appreciated that communication pathway 411 may be any suitable means of carrying information signals to wafer translator 404 from tester 410. Similarly, in the illustrative embodiment, tester 410 receives signals from a 2:1 multiplexer 406 via a communication pathway 419. As shown in FIG. 4, communication pathways 415, 417 and 419 are each n bits wide.

It is noted that tester 410 may also provide power connections in addition to information signals. It is further noted that the present invention is not limited only to the use of physical wires and may, for example, use fiber optic or wireless communication pathways to send signals to, and receive signals from, the integrated circuits on wafer 402 via wafer translator 404 and multiplexers. It is further noted that pathways from and to the tester may be serial data pathways, and that the serial data is deserialized (i.e., converted to parallel data format) at each receiving end. Deserializing data by means of a serial-in/parallel-out shift register is well-known. The present invention is not limited to any particular means of implementing communication pathways 411, 415, 417, and 419.

Figure 5A:
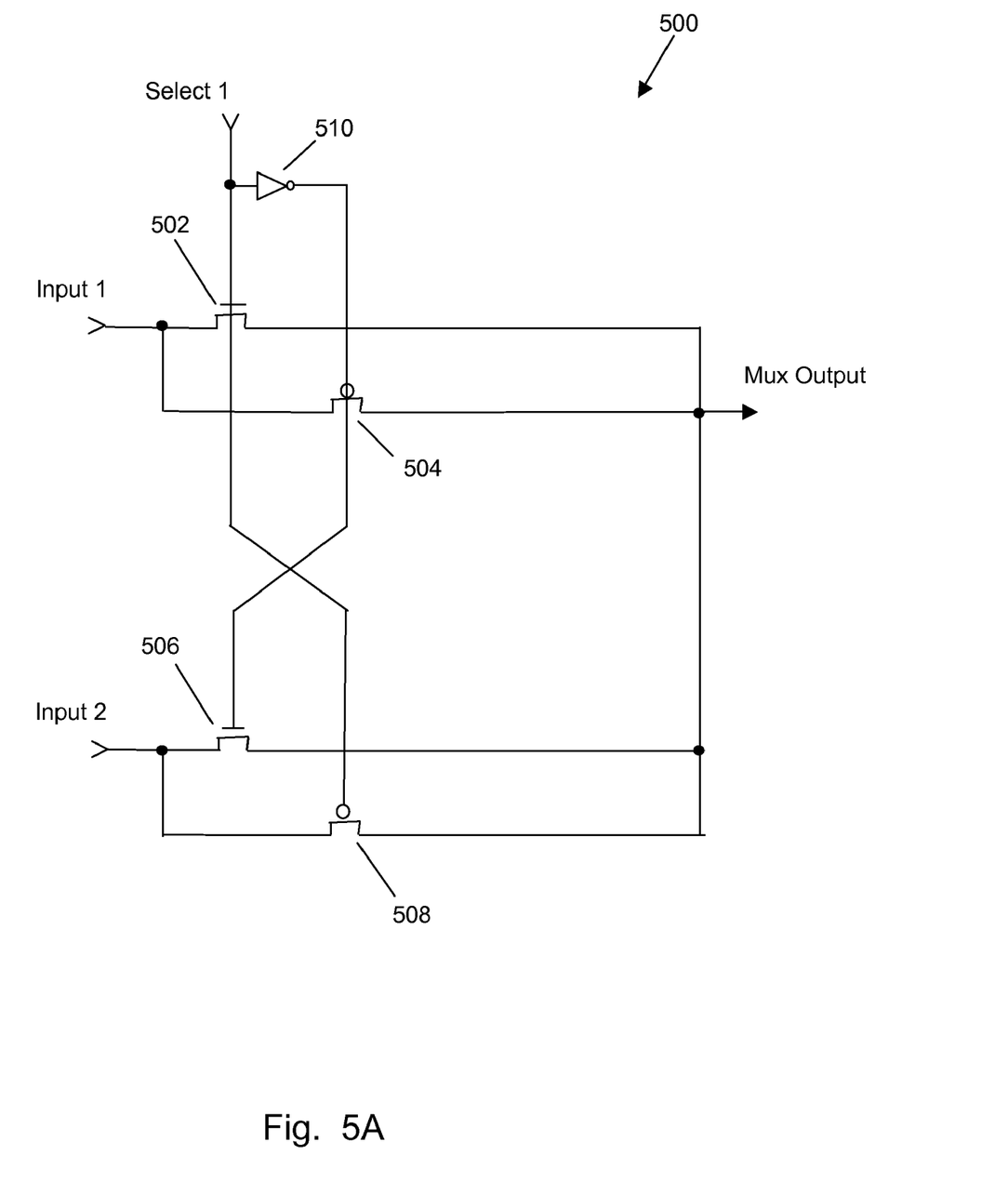
FIG. 5A is a circuit diagram of an illustrative 2:1 multiplexer circuit.
Figure 5B:
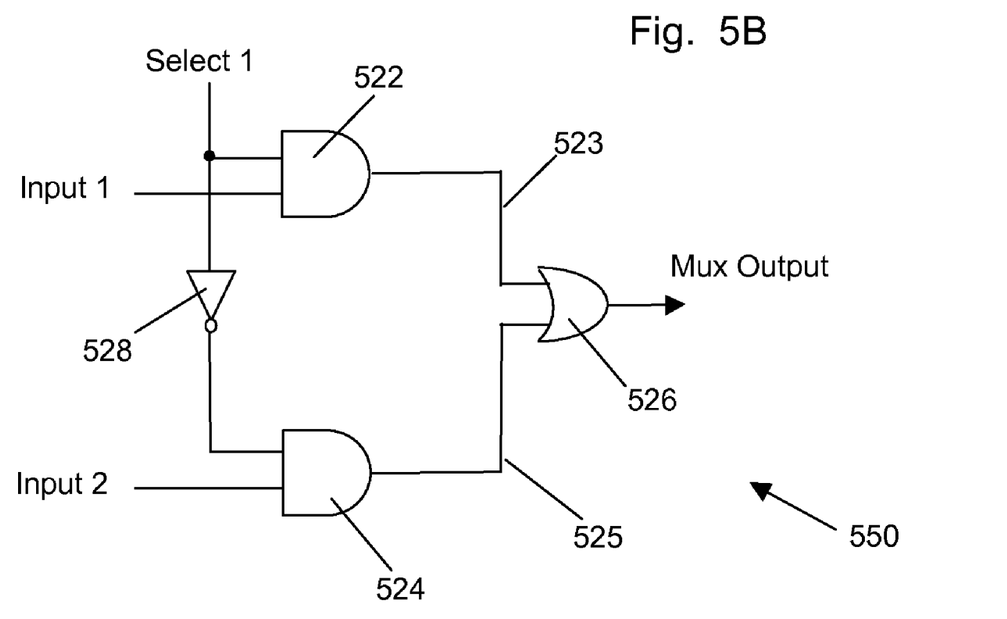
FIG. 5B is a logic diagram of another illustrative 2:1 multiplexer circuit.

Referring to FIG. 5A, a circuit diagram of an illustrative 2:1 multiplexer circuit 500 is shown. Circuit 500 includes a first input terminal Input_1, a second input terminal Input_2, an output terminal Mux_Output, a control terminal Select_1, and an inverter 510 having an input terminal coupled to Select_1, and inverter 510 having an output terminal. A first NFET 502 has a first S/D terminal coupled to Input_1, a second S/D terminal coupled to Mux_Output, and a gate terminal coupled to Select_1. A first PFET 504 has a first S/D terminal coupled to Input_1, a second S/D terminal coupled to Mux_Output, and a gate terminal coupled to the output terminal of inverter 510. A second NFET 506 has a first S/D terminal coupled to Input_2, a second S/D terminal coupled to Mux-Output, and a gate terminal coupled to the output terminal of inverter 510. A second PFET 508 has a first S/D terminal coupled to Input_2, a second S/D terminal coupled to Mux_Output, and a gate terminal coupled to Select_1. It can be seen that in operation, when Select_1 is asserted, the signal at Input_1 is passed to the Mux_Output terminal. When Select_1 is deasserted, the signal at Input_2 is passed to the Mux_Output terminal. Multiplexer 500 of FIG. 5A receives and outputs analog signal levels Referring to FIG. 5B, a logic diagram of another illustrative 2:1 multiplexer 550 is shown. Multiplexer 550 includes a first two-input AND gate 522, a second two-input AND gate 524, a two-input OR gate 526, and an inverter 528. AND gate 522 has a first input terminal coupled to receive Input_1, a second input terminal coupled to Select_1, and an output terminal coupled to a node 523. Inverter 528 has an input terminal coupled to Select_1. AND gate 522 has a first input terminal coupled to receive Input_2, a second input terminal coupled to an output terminal of inverter 528, and an output terminal coupled to a node 525. OR gate 526 has a first input terminal coupled to node 523, a second input terminal coupled to node 525, and an output terminal coupled to Mux_Output. In operation, when Select_1 is asserted, Mux_Output follows the logical value of Input_1, and when Select_1 is deasserted, Mux_Output follows the logical value of Input_2. Multiplexer 550 of FIG. 5B receives and outputs logic signal levels.

Those of ordinary skill in the art of electronics design will recognize that many alternative designs exist for implementing the function of a 2:1 multiplexer. The present invention is not limited to any particular multiplexer circuit or logic arrangement.

Figure 6A:
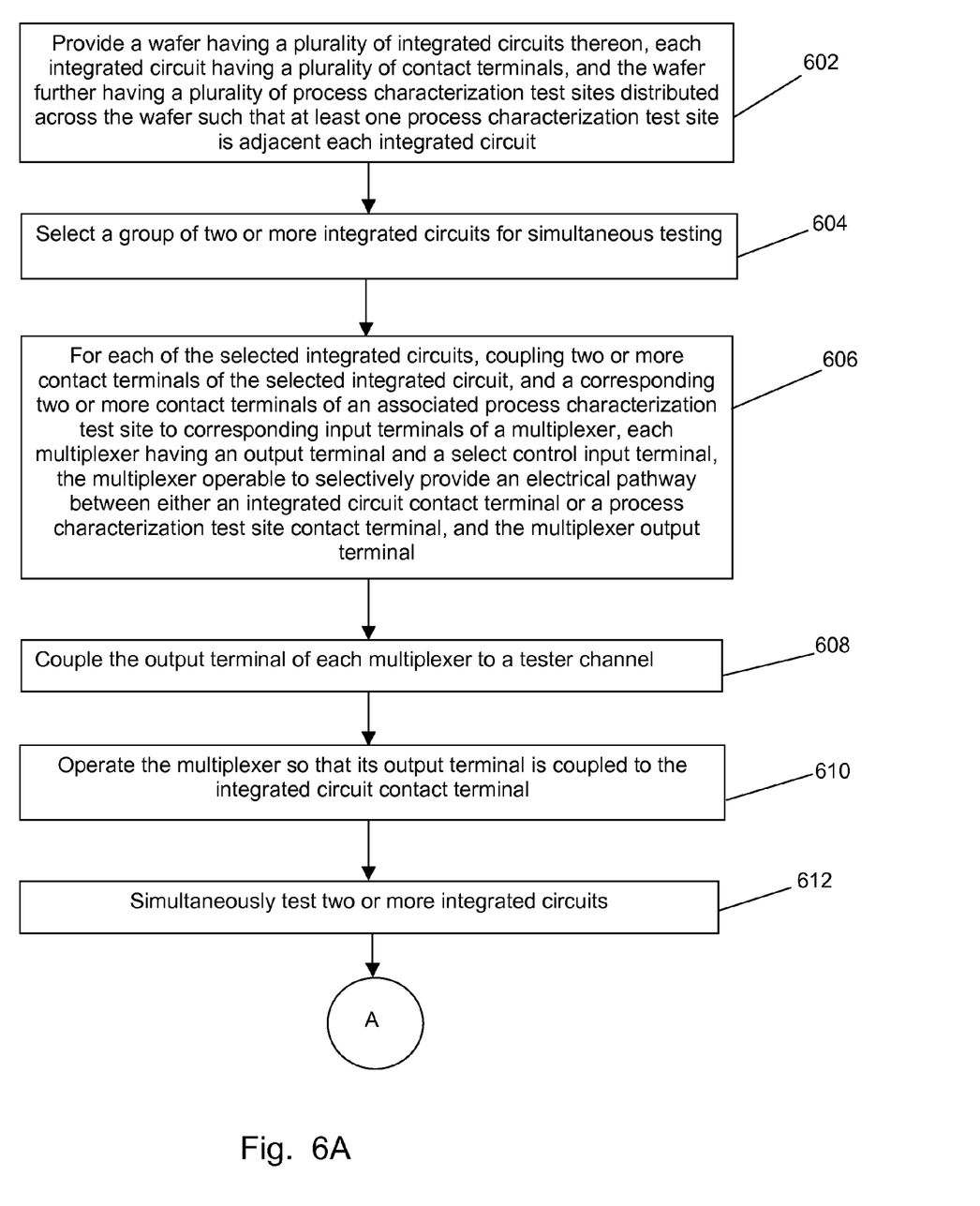
FIGS. 6A-6B are a flow diagrams of a process in accordance with the present invention.
Figure 6B:
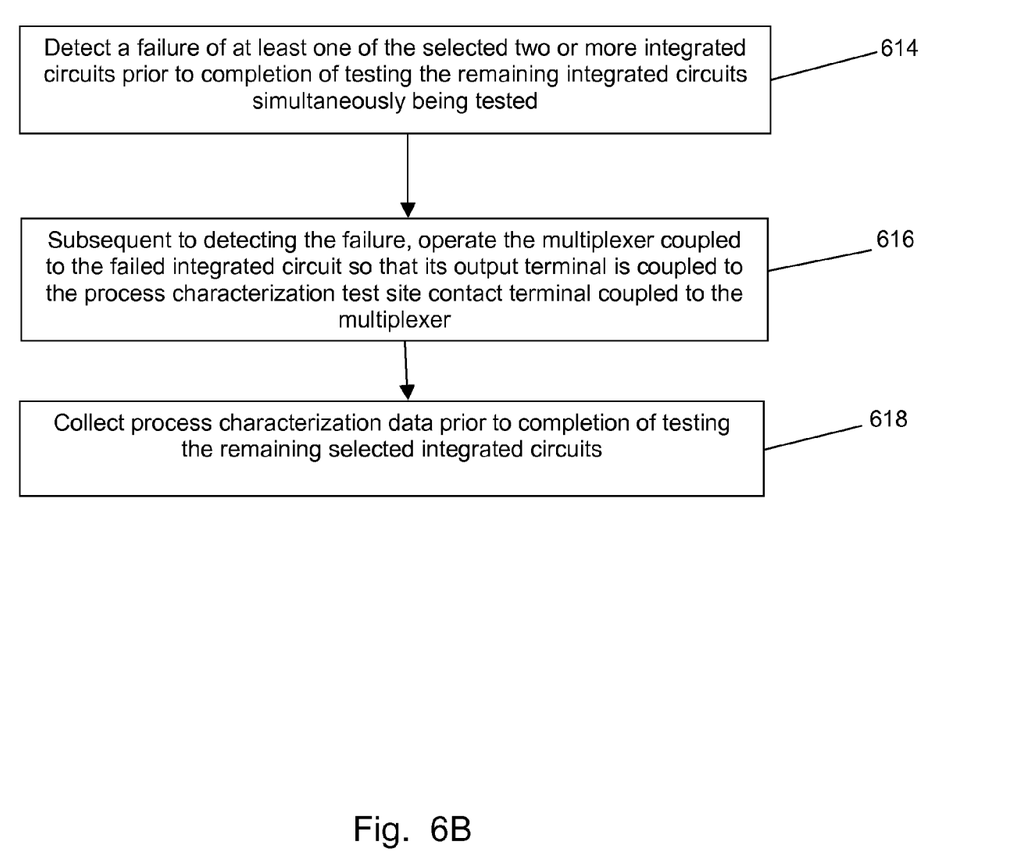

FIGS. 6A-6B are flow diagrams of a process in accordance with the present invention, that uses the post-fail time period to collect electrical data about the manufacturing process and electrical characteristics at a location proximate the failed integrated circuit in a multi-site integrated circuit test arrangement. In the illustrative embodiment of FIGS. 6A-6B, a method for collecting process characterization, or electrical parametric, data local to a failed integrated circuit, includes providing 602 a wafer having a plurality of integrated circuits thereon, each integrated circuit having a plurality of contact terminals, and the wafer further having a plurality of process characterization test sites distributed across the wafer such that at least one process characterization test site is adjacent each integrated circuit; selecting 604 a group of two or more integrated circuits for simultaneous, or concurrent, testing; for each of the selected integrated circuits, coupling 606 two or more contact terminals of the selected integrated circuit, and a corresponding two or more contact terminals of an associated process characterization test site to corresponding input terminals of a multiplexer, each multiplexer having an output terminal and a select control input terminal, the multiplexer operable to selectively provide an electrical pathway between either an integrated circuit contact terminal or a process characterization test site contact terminal, and the multiplexer output terminal; coupling 608 the output terminal of each multiplexer to a tester channel; operating 610 the multiplexer so that its output terminal is coupled to the integrated circuit contact terminal; simultaneously testing 612 two or more integrated circuits; detecting 614 a failure of at least one of the selected two or more integrated circuits prior to completion of testing the remaining integrated circuits simultaneously being tested; subsequent to detecting the failure, operating 616 the multiplexer coupled to the failed integrated circuit so that its output terminal is coupled to the process characterization test site contact terminal coupled to the multiplexer; and collecting 618 process characterization data prior to completion of testing the remaining integrated circuits simultaneously being tested. It is noted that in typical embodiments, the associated process characterization test site is adjacent to the selected integrated circuit. In alternative embodiments, process characterization test sites may be disposed on the integrated circuits. In still further alternative embodiments, there may be a first group of process characterization test sites located adjacent to the integrated circuits, and a second group of process characterization test sites disposed on the integrated circuits.

In some embodiments, selecting a group of two or more integrated circuits for simultaneous, or concurrent, testing is determined by the placement of the probe contact structures of a probe card relative to the contact terminals on the inquiry-side of the wafer translator. For example, a probe card that has enough probes on it to engage with the signal paths for two or more integrated circuits, can be used to couple a plurality of tester channels to two or more DUTs simultaneously. In such an example, the wafer translator is removably attached to a wafer and its wafer-side contact terminals are in contact with the contact terminals of a first plurality of the integrated circuits thereon and with the contact terminals of a first plurality of process characterization test sites thereon; the wafer-side contact terminals are coupled to corresponding contact terminals on the inquiry-side of the wafer translator; and the probe contact structures of the probe card contact the inquiry-side contact terminals of two or more integrated circuits.

In some embodiments of the present invention, the electrical pathways between the integrated circuits and the multiplexer, and between the process characterization test site and the multiplexer, are provided by a wafer translator, and the method includes removably attaching the wafer and a wafer translator to form a wafer/wafer translator pair in the attached state; wherein the contact terminals of the selected integrated circuits and the contact terminals of the associated process characterization test sites are in electrical communication with contact structures disposed on a wafer-side of the wafer translator. It is noted that, typically, the contact terminals of the selected integrated circuits and the contact terminals of the associated process characterization test sites are physically in contact with contact structures disposed on a wafer-side of the wafer translator when the wafer and wafer translator are removably attached to form a wafer/wafer translator pair in the attached state.

In some embodiments, the wafer translator includes a rigid substrate, whereas in other embodiments the wafer translator may include a flexible substrate.

Conclusion

The exemplary methods and apparatus illustrated and described herein find application in at least the field of integrated circuit test and analysis.

It is to be understood that the present invention is not limited to the illustrative embodiments described above, but encompasses any and all embodiments within the scope of the subjoined Claims and their equivalents.

What is claimed is:

1. A method for collecting process characterization data local to a failed integrated circuit, comprising:
   providing a wafer having a plurality of integrated circuits thereon, each integrated circuit having a plurality of contact terminals, and the wafer further having a plurality of process characterization test sites distributed across the wafer such that at least one process characterization test site is adjacent each integrated circuit;
   selecting a group of two or more integrated circuits for simultaneous testing;
   for each of the selected integrated circuits, coupling two or more contact terminals of the selected integrated circuit, and a corresponding two or more contact terminals of an associated process characterization test site to corresponding input terminals of a multiplexer, each multiplexer having an output terminal and a select control input terminal, the multiplexer operable to selectively provide an electrical pathway between either an integrated circuit contact terminal or a process characterization test site contact terminal, and the multiplexer output terminal;
   coupling the output terminal of each multiplexer to a tester channel;
   operating the multiplexer so that its output terminal is coupled to the integrated circuit contact terminal;
   simultaneously testing two or more of the selected integrated circuits;
   detecting a failure of at least one of the selected two or more integrated circuits prior to completion of testing the remaining integrated circuits simultaneously being tested;
   subsequent to detecting the failure, operating the multiplexer coupled to the failed integrated so that the output terminal of the multiplexer is coupled to the process characterization test site contact terminal coupled to that multiplexer; and
   collecting process characterization data prior to completion of testing the remaining selected integrated circuits.

2. The method of claim 1, wherein the associated process characterization test site is adjacent to the selected integrated circuit.

3. The method of claim 1, further comprising:
   removably attaching the wafer and a wafer translator to form a wafer/wafer translator pair in the attached state;
   wherein the contact terminals of the selected integrated circuits and the contact terminals of the associated process characterization test sites are in electrical communication with contact structures disposed on a wafer-side of the wafer translator.

4. The method of claim 1, further comprising:
   removably attaching the wafer and a wafer translator to form a wafer/wafer translator pair in the attached state;
   wherein the contact terminals of the selected integrated circuits and the contact terminals of the associated process characterization test sites are physically in contact with contact structures disposed on a wafer-side of the wafer translator.

5. The method of claim 3, wherein the wafer translator includes a rigid substrate.

6. The method of claim 3, wherein the wafer translator includes a flexible substrate.

7. The method of claim 1, further comprising:
   providing one or more driving signals to a process characterization test site from the tester.

8. The method of claim 1, wherein operating the multiplexer includes receiving information from the tester.

9. The method of claim 8, wherein information from the tester is received by a logic circuit that generates a select control signal responsive to the information received from the tester.

10. A method for collecting process characterization data local to a failed integrated circuit, comprising:
   providing a wafer having a plurality of integrated circuits thereon, each integrated circuit having a plurality of contact terminals, and the wafer further having a plurality of process characterization test sites distributed across the wafer such that at least one process characterization test site is disposed on each integrated circuit;
   selecting a group of two or more integrated circuits for simultaneous testing;
   for each of the selected integrated circuits, coupling two or more contact terminals of the selected integrated circuit, and a corresponding two or more contact terminals of an associated process characterization test site to corresponding input terminals of a multiplexer, each multiplexer having an output terminal and a select control input terminal, the multiplexer operable to selectively provide an electrical pathway between either an integrated circuit contact terminal or a process characterization test site contact terminal, and the multiplexer output terminal;

coupling the output terminal of each multiplexer to a tester channel;

operating the multiplexer so that its output terminal is coupled to the integrated circuit contact terminal;

simultaneously testing two or more of the selected integrated circuits;

detecting a failure of at least one of the selected two or more integrated circuits prior to completion of testing the remaining integrated circuits simultaneously being tested;

subsequent to detecting the failure, operating the multiplexer coupled to the failed integrated so that its output terminal is coupled to the process characterization test site contact terminal coupled to that multiplexer; and collecting process characterization data prior to completion of testing the remaining selected integrated circuits.

* * * * *